(12) United States Patent
Stuckey

(10) Patent No.: US 8,170,839 B2
(45) Date of Patent: May 1, 2012

(54) METHOD OF DESIGNING A TIRE TREAD

(75) Inventor: Jon I. Stuckey, Louisville, OH (US)

(73) Assignee: Bridgestone Americas Tire Operations, LLC, Nashvile, TN (US)

( * ) Notice: Subject to any disclaimer, the term of this patent is extended or adjusted under 35 U.S.C. 154(b) by 434 days.

(21) Appl. No.: 12/429,204

(22) Filed: Apr. 24, 2009

(65) Prior Publication Data

US 2010/0274533 A1 Oct. 28, 2010

(51) Int. Cl.
*G06F 17/50* (2006.01)
(52) U.S. Cl. .......................................................... 703/1
(58) Field of Classification Search ....................... 703/1
See application file for complete search history.

(56) References Cited

U.S. PATENT DOCUMENTS

| | | | |
|---|---|---|---|
| 5,213,642 A * | 5/1993 | Sponagel | 152/455 |
| 5,327,952 A | 7/1994 | Glover et al. | |
| 5,343,918 A | 9/1994 | Fontaine | |
| 5,388,625 A | 2/1995 | White | |
| 5,394,916 A | 3/1995 | Williams | |
| 5,407,005 A | 4/1995 | Consolacion et al. | |
| 5,421,387 A | 6/1995 | Emerson | |
| 5,733,393 A | 3/1998 | Hubbell et al. | |
| 5,824,169 A | 10/1998 | Landers et al. | |
| 6,083,268 A * | 7/2000 | Kelsey et al. | 703/7 |
| 6,409,861 B1 | 6/2002 | Yukawa | |
| 6,450,223 B1 | 9/2002 | Landers et al. | |
| 6,539,788 B1 | 4/2003 | Mancosu et al. | |
| 6,609,548 B2 | 8/2003 | Kousaie et al. | |
| 6,719,025 B2 | 4/2004 | Caretta et al. | |
| 6,923,232 B1 * | 8/2005 | Welbes et al. | 152/209.18 |
| 7,143,798 B2 | 12/2006 | Ratliff, Jr. | |
| 7,213,451 B2 | 5/2007 | Zhu et al. | |
| 2001/0032694 A1 | 10/2001 | Ishiyama | |

(Continued)

FOREIGN PATENT DOCUMENTS

JP H06-143940 5/1994

(Continued)

OTHER PUBLICATIONS

R.E. Okonieski et al., "Simplified approach to calculating geometric stiffness properties of tread pattern elements," 2003, Tire Science & Technology, vol. 31, issue 3, pp. 132-158.*

(Continued)

*Primary Examiner* — Paul Rodriguez
*Assistant Examiner* — Russ Guill
(74) *Attorney, Agent, or Firm* — Shaun J. Fox; Bryan Jaketic

(57) ABSTRACT

A tire design method is provided for a tire having a tire tread with a plurality of circumferential ribs separated by circumferential continuous grooves where at least two circumferential ribs are unlocked by at least one circumferential groove. The method may include modeling a lug in each of the at least two circumferential ribs to determine a circumferential shear stiffness and a circumferential shear stiffness per unit length for each rib. The tire design method may further include determining an ideal rib stiffness, an optimal rib stiffness, and a corresponding ideal number of lugs and an optimal number of lugs for each of the at least two circumferential ribs. In one embodiment, the tire design method includes modifying the tire design so the number of lugs in each rib is equal to the optimal number of lugs determined in the tire design method.

17 Claims, 8 Drawing Sheets

U.S. PATENT DOCUMENTS

| | | |
|---|---|---|
| 2002/0144762 A1 | 10/2002 | Peda et al. |
| 2003/0150539 A1 | 8/2003 | Kolowski et al. |
| 2007/0000590 A1 | 1/2007 | Murata |

FOREIGN PATENT DOCUMENTS

| | | |
|---|---|---|
| JP | H07-052610 | 2/1995 |
| JP | H07-164815 | 6/1995 |
| JP | 2001187518 | 7/2001 |
| KR | 2003042061 | 5/2003 |

OTHER PUBLICATIONS

Hans B. Pacejka, "A hybrid computer model of tire shear force generation," 1971, Automobile Manufacturers Association, pp. 1-71.*

George Gaston Feider et al., European Patent Application EP2045104.*

G. Mavros et al., "Transient analysis of tyre friction generation using a brush model with interconnected viscoelastic bristles," 2005, Proceedings of the Institution of Mechanical Engineers, Part K: Journal of Multi-body Dynamics, vol. 219, pp. 275-283.*

Chun Hee Kim, International Search Report and Written Opinion of the International Searching Authority, Dec. 29, 2010, pp. 1-9, Korea.

Engineering Village Accession No. 034577008637, copyright 2006. Okonieski, R.E.; Moseley, D.J.; Cai, K.Y.; Simplified Approach to Calculating Geometric Stiffness Properties of Tread Pattern Elements, Tire Science and Technology, 2003, pp. 132-158, V. 31, Issue n 3, published by Tire Society, Inc., Akron, OH USA.

Engineering Village Accession No. 03097379016, copyright 2006. Gudkov, V.A.; Tarnovskij, V.M.; Shiryaev, S.A.; Kubrakov, V.P.; Effect of Stiffness Characteristics of Car Tire on Wear of Tread, Kauchuk I. Rezina, 2002, pp. 29-32, Issue n 6, published by Kauchuk I. Rezina.

Engineering Village Accession No. 8029128, copyright 2006. Andersson, P.; Larsson, K.; Wullens, F.; Kropp, W.; High Frequency Dynamic Behaviour of Smooth and Patterned Passenger Car Tyres, Acta Acustica United with Acustica, May-Jun. 2004, pp. 445-456, vol. 90, Issue 3, published by S. Hirzel, Germany.

* cited by examiner

US 8,170,839 B2

METHOD OF DESIGNING A TIRE TREAD

FIELD OF INVENTION

The present application is directed to a tire design method. More particularly, the present application is directed to a method of designing a tire tread to reduce variation in stiffness.

BACKGROUND

Tire stiffness is an amount of deflection produced for a given amount of load, or force divided by deflection. Tire designers have designed tire treads that produce varying stiffness in different parts of the tire, including varying stiffness in the sidewall, shoulder, and tire tread. The varying stiffness is a symptom of varying tread characteristics.

SUMMARY

A tire design method is provided for a tire having a tire tread with a plurality of circumferential ribs separated by circumferential continuous grooves where at least two circumferential ribs are unlocked by at least one circumferential groove. The method may include modeling a lug in each of the at least two circumferential ribs to determine a circumferential shear stiffness and a circumferential shear stiffness per unit length for each rib. The tire design method may further include determining an ideal rib stiffness, an optimal rib stiffness, and a corresponding ideal number of lugs and an optimal number of lugs for each of the at least two circumferential ribs. In one embodiment, the tire design method includes modifying the tire design so the number of lugs in each rib is equal to the optimal number of lugs determined in the tire design method.

BRIEF DESCRIPTION OF THE DRAWINGS

In the accompanying drawings, embodiments of a method of designing a tire tread are illustrated that, together with the detailed description provided below, describe various embodiments of the design method. One of ordinary skill in the art will appreciate that a step may be designed as multiple steps or that multiple steps may be designed as a single step.

Further, in the accompanying drawings and description that follow, like parts are indicated throughout the drawings and written description with the same reference numerals, respectively. Some figures may not be drawn to scale and the proportions of certain parts may have been exaggerated for convenience of illustration.

DETAILED DESCRIPTION

The following definitions are provided to aid in the understanding of the invention. The definitions include various examples and/or forms of components that fall within the scope of a term and that may be used for implementation. The examples are not intended to be limiting. Both singular and plural forms of terms may be within the definitions.

"Axial" and "axially" refer to a direction that is parallel to the axis of rotation of a tire.

"Circumferential" and "circumferentially" refer to a direction extending along the perimeter of the surface of the tire at a constant radius from the axis of rotation.

"Equatorial plane" refers to the plane that is perpendicular to the tire's axis of rotation and passes through the center of the tire's tread.

"Footprint" refers to the area of the tread of the tire that makes contact with the ground.

"Lateral" refers to a direction along the tread of the tire going from one sidewall to the other sidewall.

"Modeling" refers to making a drawing, either on paper or displayed by a computer, of a tire design and the design related attributes, including but not limited to, dimensions, material properties, application of standard modeling, including finite element analysis, and the like.

"Radial" and "radially" refer to a direction perpendicular to the axis of rotation of the tire.

"Sidewall" refers to that portion of the tire between the footprint of the tread and the bead, so the sidewall includes the buttress portion as defined above.

"Tire designer" refers to at least one of the following: an engineer, a technician, a designer, a consultant, a manager, any person trained to model tires, a computer, and a computer program.

"Tread" refers to that portion of the tire that comes into contact with the road under normal inflation and load.

Figure 1A:
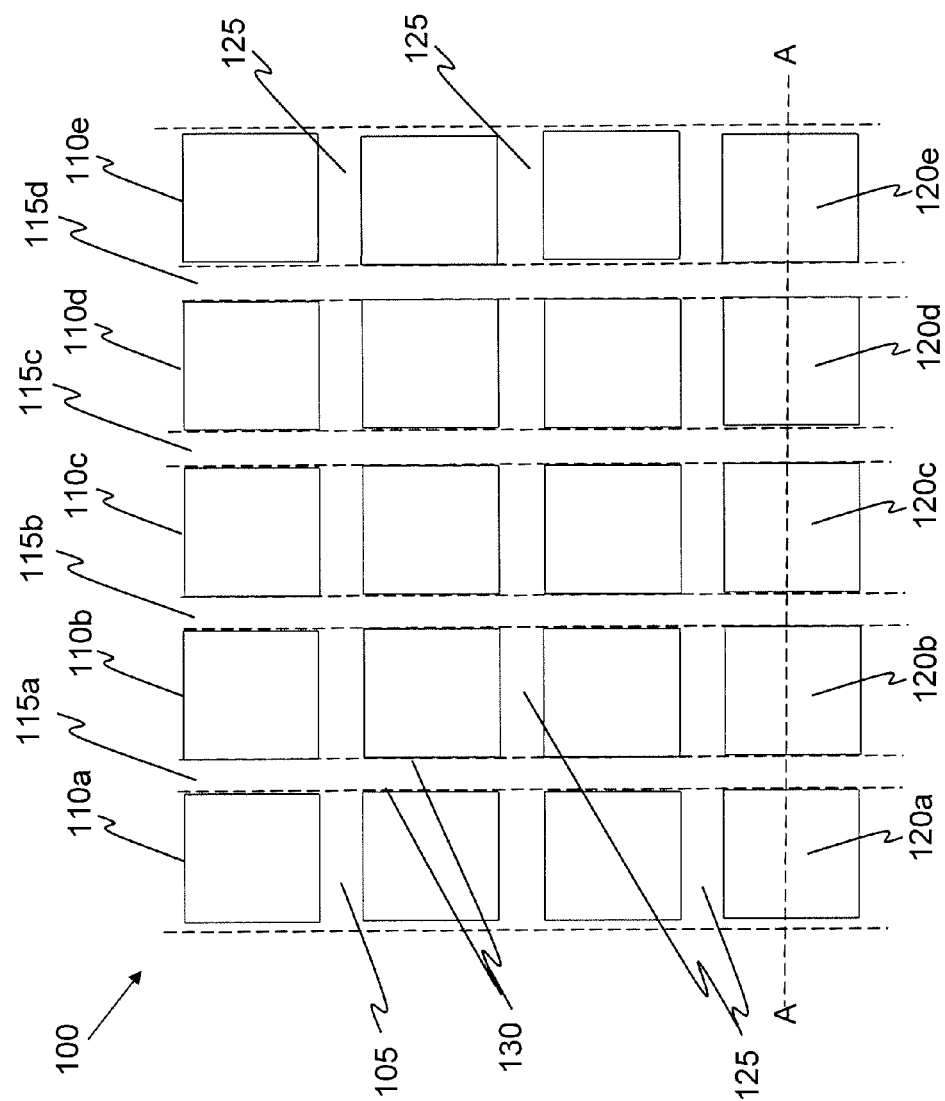
FIG. 1A illustrates a top view of a portion of a tread of a tire.
Figure 1B:
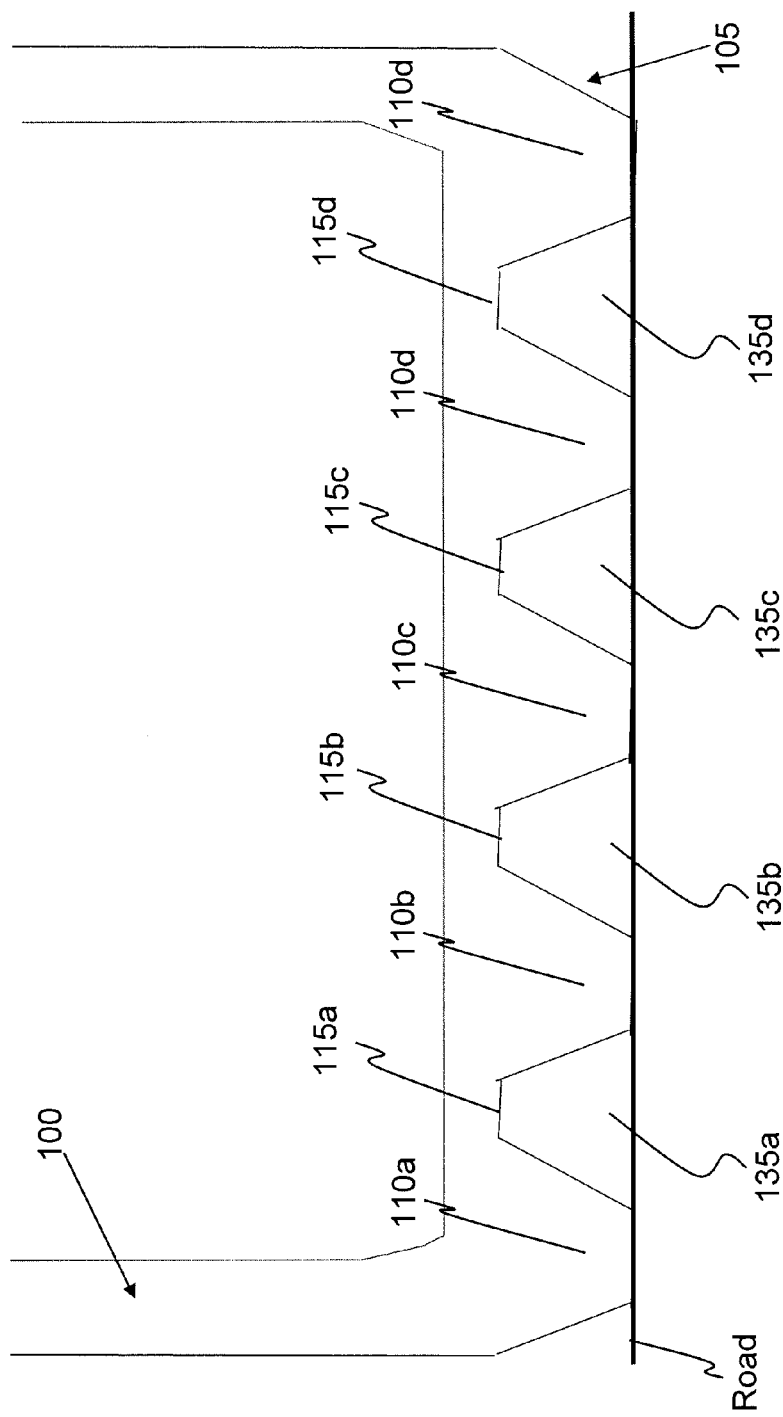
FIG. 1B illustrates a cross section of the tire tread along the line A-A of FIG. 1A.

FIG. 1A is a schematic drawing of a top view of a tire 100 with a tread 105 and FIG. 1B illustrates a cross section of the tire tread 105, along the line A-A of FIG. 1A, that is on a horizontal surface; e.g. a road. In FIG. 1A, tire 100 further includes at least two circumferential ribs 110 that are laterally separated by at least one circumferential groove 115. Each of the at least two circumferential ribs 110 include a series of lugs 120, wherein each lug 120 is separated from another lug in the same circumferential rib 110 by a lateral groove 125. The series of lugs 120 in each of the at least two circumferential ribs 110 are in an unlocked relationship, so there is a circumferentially continuous window 135a-d (see FIG. 1B; the axial length of the window is represented as dashed lines in FIG. 1A) in the at least one circumferential groove 115a-d between adjacent lateral edges 130 of each rib. In other words, there is a circumferentially continuous window 135 formed by the at least one circumferential groove 115, adjacent lateral edges 130 of each rib, and the horizontal surface.

In FIG. 1A, the at least two circumferential ribs 110 include five circumferential ribs 110a-e, each having the same number of lugs 120a-e and the same number of lateral grooves 125 around the circumference of tire 100. Each lug 120a-e has the same circumferential length and the width of each rib 110a-e is about the same. In another exemplary embodiment, the width of each rib 110a-e and the number of lugs 120a-e vary.

Four circumferential grooves 115a-d separate the five circumferential ribs 110a-e, e.g., circumferential groove 115a separates circumferential rib 110a laterally from circumferential rib 110b and circumferential groove 115b separates circumferential rib 110b laterally from circumferential rib 110c, etc.

Figure 2:
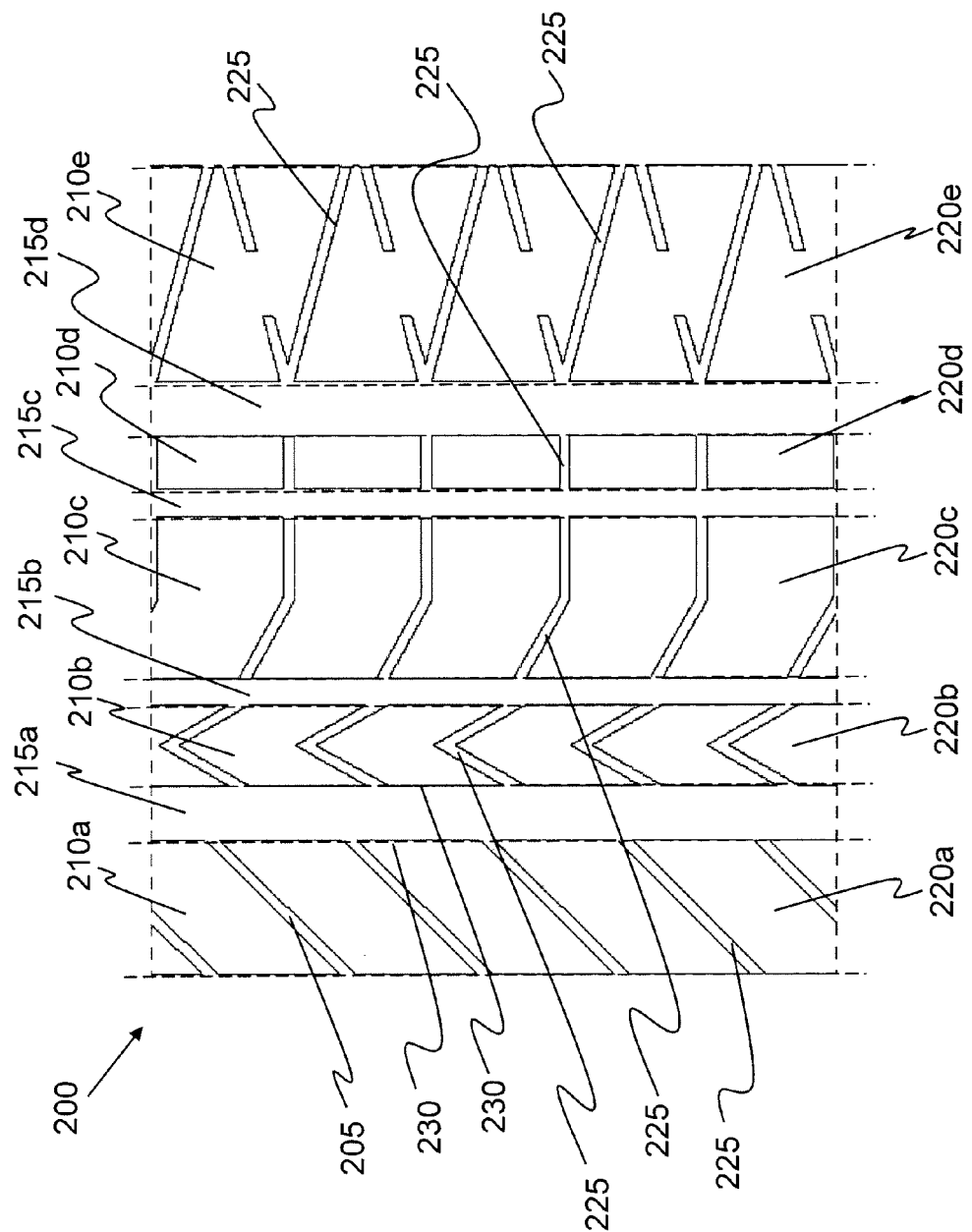
FIG. 2 illustrates a top view of a portion of a tread of another tire.

FIG. 2 illustrates a top view of a tire 200 with a tread 205 that will be used to demonstrate an exemplary tire before the balanced rib stiffness design method is applied. Tire 200 includes at least two circumferential ribs 210 that are laterally separated by at least one circumferential groove 215. Each rib of the at least two circumferential ribs 210 comprises a series of lugs 220, wherein each lug 220 is separated from another lug in the same circumferential rib 210 by a lateral groove 225. The series of lugs 220 in each of the at least two circumferential ribs 210 are in an unlocked relationship, so there is a circumferentially continuous window (the axial length of the window is represented as dashed lines) in the at least one circumferential groove 215 between adjacent lateral edges 230 of each rib. In the illustrated embodiment, the at least two circumferential ribs 210 include five circumferential ribs 210a-e that each may have a different number of lugs 220a-e. Further, lugs 220a-e can each have different circumferential lengths, different circumferential widths, and different shapes. Four circumferential grooves 215a-d separate the five circumferential ribs 210a-e, e.g., circumferential groove 215a separates circumferential rib 210a laterally from circumferential rib 210b and circumferential groove 215b separates circumferential rib 210b laterally from circumferential rib 210c, etc.

Figure 3:
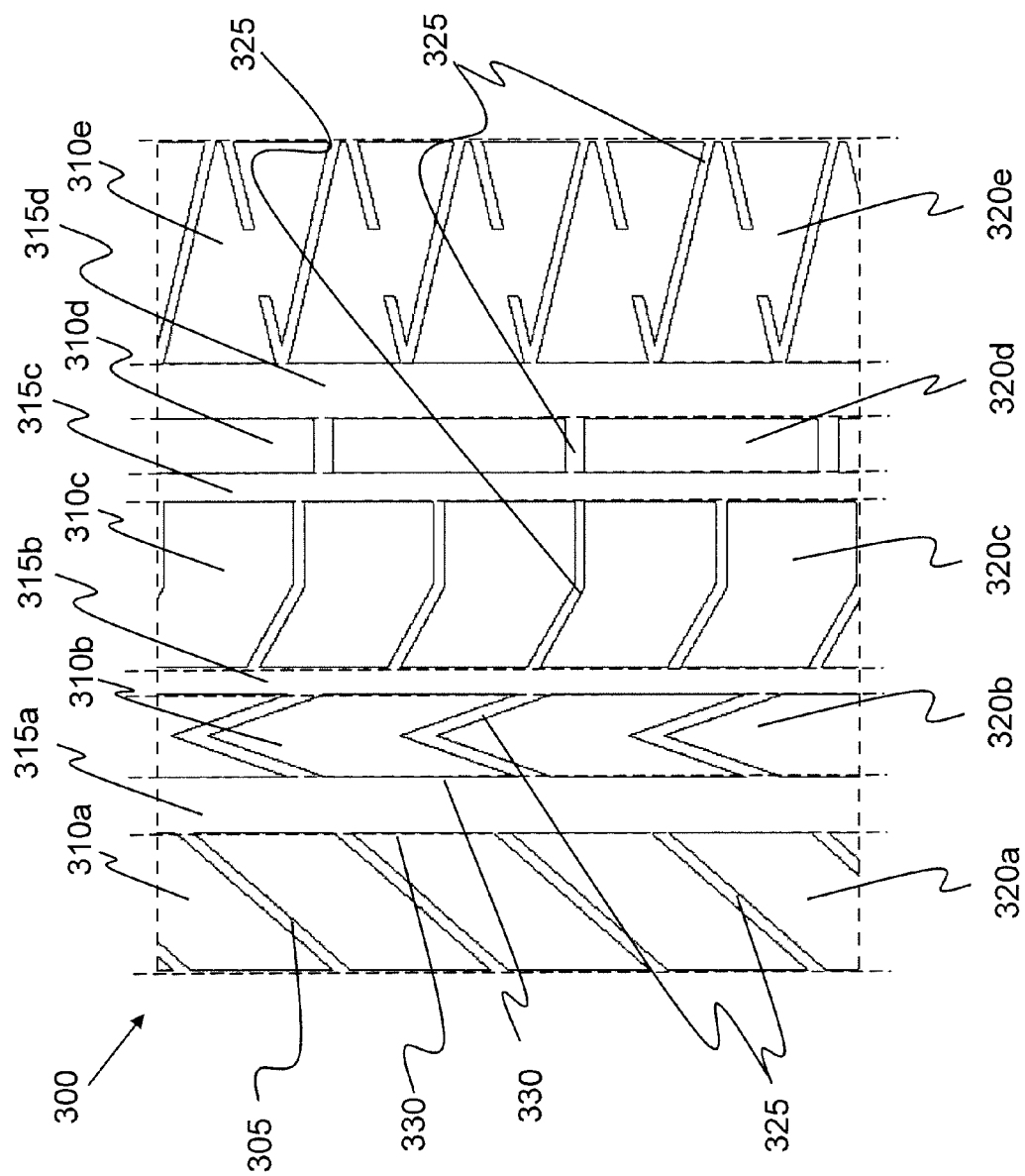
FIG. 3 illustrates a top view of a portion of a tread of another tire.

FIG. 3 illustrates a top view of a tire 300 with a tread 305 that will be used to demonstrate an exemplary tire having balanced rib stiffness. Tire 300 is substantially the same as the tire 200 of FIG. 2, except for the differences discussed below. Tire 300 includes a series of lugs 320 having varying lengths compared to the lengths of the series of lugs 220 in FIG. 2. For example, circumferential rib 210b has from about 4 to about 5 lugs 220b in the section of the tire shown in FIG. 2 and circumferential rib 310b has about 3 lugs 320b in the same section of the tire shown in FIG. 3. Further, circumferential rib 210d has from about 5 lugs 220d in the section of the tire shown in FIG. 2 and circumferential rib 310d has about 3 lugs 320b in the same section of the tire shown in FIG. 3.

Lugs 320 of any shape may be used. However, for two adjacent circumferential ribs 310 to have differing numbers of lugs 320, the ribs are in an unlocked relationship. In an alternative embodiment (not shown), the tire 300 may include a greater or fewer number of the circumferential ribs 310 than what is illustrated in FIG. 3. In another alternative embodiment, one or more of the circumferential ribs 310 may be circumferentially continuous, without any lateral grooves 325.

Tire 300 includes at least two circumferential ribs 310 that are laterally separated by at least one circumferential groove 315. Each rib of the at least two circumferential ribs 310 comprises a series of lugs 320, wherein each lug 320 is separated from another lug in the same circumferential rib 310 by a lateral groove 325. The series of lugs 320 in each of the at least two circumferential ribs 310 are in an unlocked relationship, so there is a circumferentially continuous window (the axial length of the window is represented as an axial distance between dashed lines) in the at least one circumferential groove 315 between adjacent lateral edges 330 of each rib. In the illustrated embodiment, the at least two circumferential ribs 310 include five circumferential ribs 310a-e that each may have a different number of lugs 320a-e. Lugs 320a-e can each have different circumferential lengths, different circumferential widths, and different shapes. Four circumferential grooves 315a-d separate the five circumferential ribs 310a-e, e.g., circumferential groove 315a separates circumferential rib 310a laterally from circumferential rib 310b and circumferential groove 315b separates circumferential rib 310b laterally from circumferential rib 310c, etc.

Figure 4:
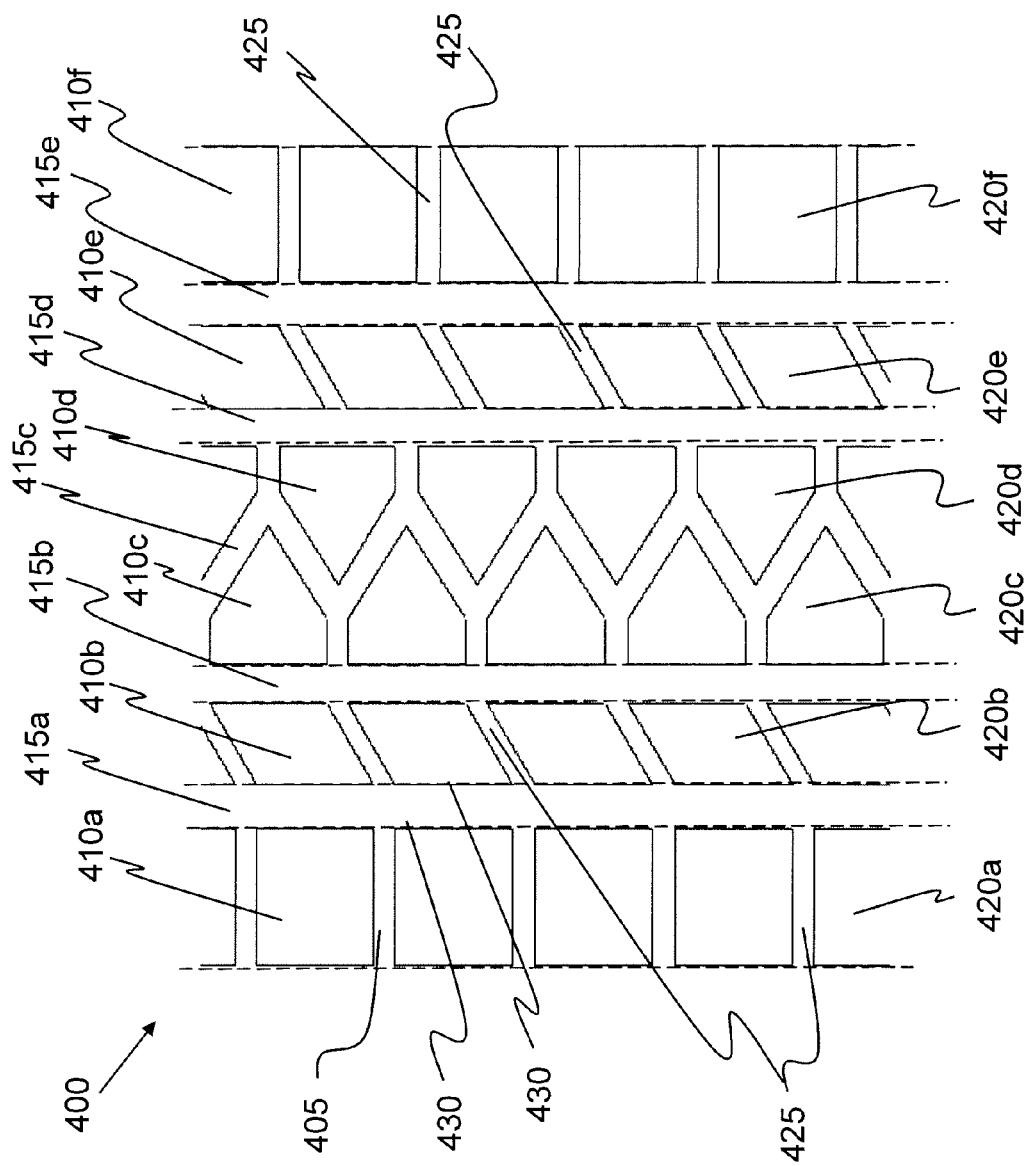
FIG. 4 illustrates a top view of a portion of a tread of yet another tire.

FIG. 4 illustrates a top view of a tire 400 with a tread 405 that demonstrates another exemplary tire before the balanced rib stiffness design method is applied to the tire design. Tire 400 includes at least two circumferential ribs 410 that are laterally separated by at least one circumferential groove 415. Each rib of the at least two circumferential ribs 410 comprises a series of lugs 420, wherein each lug 420 is separated from another lug in the same circumferential rib 410 by a lateral groove 425.

In the illustrated embodiment, the at least two circumferential ribs 410 include six circumferential ribs 410a-f that each may have a different number of lugs 420a-f. Lugs 420a-f can each have different circumferential lengths and different circumferential widths. Five circumferential grooves 415a-e separate the six circumferential ribs 410a-f, e.g., circumferential groove 415a separates circumferential rib 410a laterally from circumferential rib 410b and circumferential groove 415b separates circumferential rib 410b laterally from circumferential rib 410c.

The series of lugs 420 in each of the at least two circumferential ribs 410 are in an unlocked relationship, except circumferential ribs 410c and 410d, so there is a circumferentially continuous window (the axial length of the window is represented as an axial distance between dashed lines) formed by circumferential grooves 415a, 415b, 415d, and 415e. Circumferential ribs 410c and 410d are in a locked relationship because the cross section of circumferential ribs 410c and 410d and circumferential groove 415c do not form a circumferentially continuous window.

Figure 5:
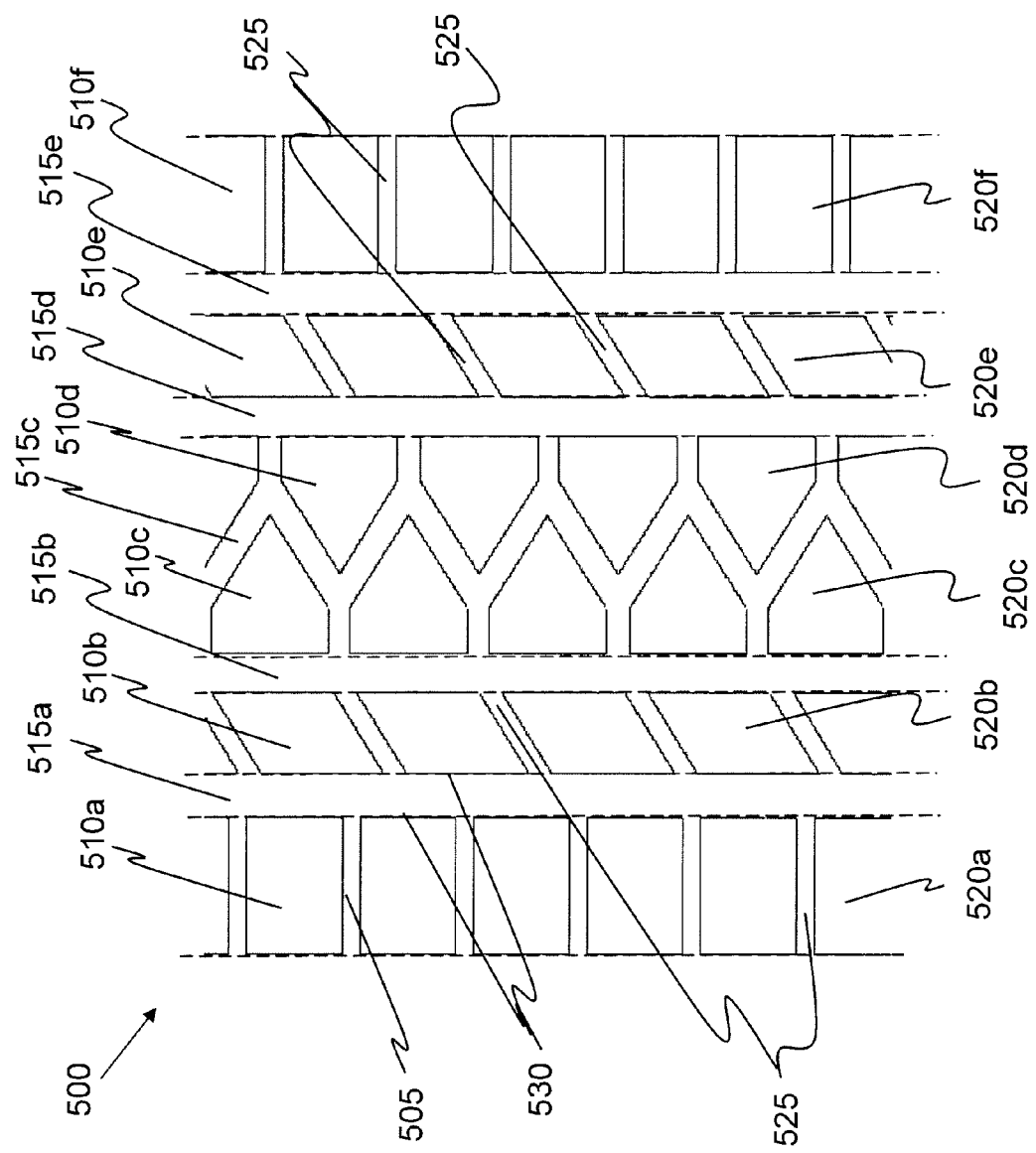
FIG. 5 illustrates a top view of a portion of a tread of still another tire.

FIG. 5 illustrates a top view of another tire 500 with a tread 505 that illustrates an embodiment of a tire having balanced rib stiffness. Tire 500 includes circumferential ribs 510a-f with circumferential grooves 515a-e disposed between lateral edges 530 of each circumferential rib 510. Tire 500 further includes lateral grooves 525 disposed along the circumferential ribs 510. Tire 500 is substantially the same as the tire 400 of FIG. 4, except for the differences discussed below. Tire 500 includes a series of lugs 520 having varying lengths compared to the lengths of the series of lugs 420 in FIG. 4. For example, circumferential rib 410a has about 5 lugs 420a in the section of the tire shown in FIG. 4 and circumferential rib 510a has about 6 lugs 520a in the same section of the tire shown in FIG. 5. Further, circumferential rib 410f has about 5 lugs 420f in the section of the tire shown in FIG. 4 and circumferential rib 510f has about 6 lugs 520f in the same section of the tire shown in FIG. 5.

Tire 500 includes a series of lugs 520. Lugs 520 of any shape may be used. However, for two circumferential ribs 510 to have differing number of lugs 520, the ribs are in an unlocked relationship. In the illustrated embodiment, two of the at least two circumferential ribs 510 are in an unlocked relationship because circumferential ribs 510a, 510b, 510e, and 510f are in an unlocked relationship.

For a given tire with at least two circumferential ribs and at least one circumferentially continuous groove, e.g., the tires illustrated in FIGS. 2 and 3 and the tires illustrated in FIGS. 4 and 5, a tire designer includes in the tire design a number of lugs in each of the at least two circumferential ribs. The tire designer selects the number of lugs in each rib according to various performance characteristics or aesthetic characteristics that are desired. The tire designer then models a single lug of each rib to determine circumferential shear stiffness. A tire designer can model the circumferential shear stiffness of a single lug by using known modeling techniques, e.g., a computer finite element analysis modeling technique.

Figure 6:
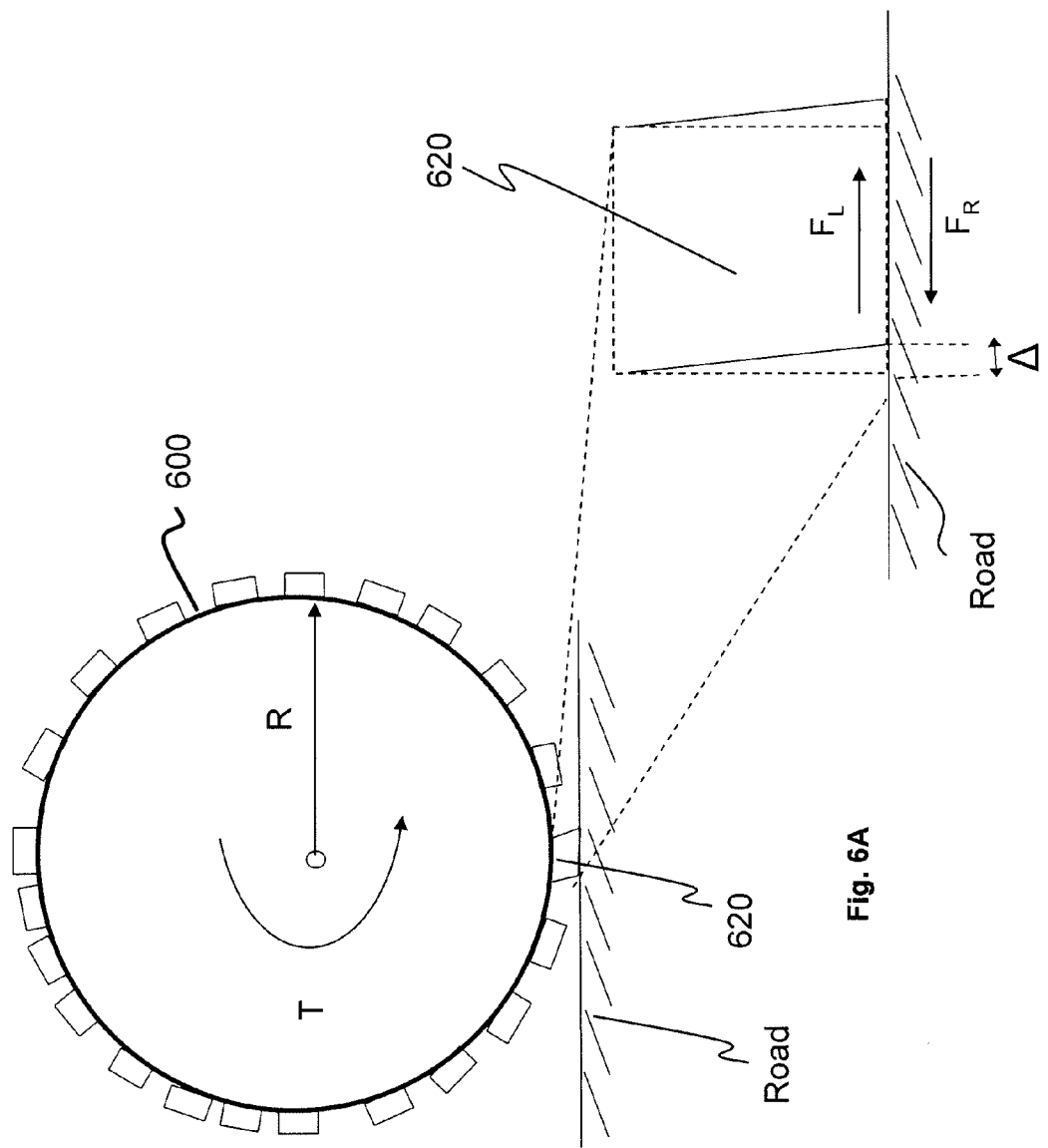
FIG. 6A illustrates a side view of a tire on a road.
FIG. 6B illustrates a close-up view of a free body diagram of a lateral view of a lug of the tire illustrated in FIG. 6A that is used to model circumferential shear stiffness.

FIG. 6A is a schematic of a side view of a tire 600 with a lug 620 on a road where the tire has a radius R and is rotating with a torque T. FIG. 6B illustrates a close-up view of a free body diagram of a lateral view of the lug 620 of the tire 600 that is illustrated in FIG. 6A. In the close-up view of FIG. 6B, a lug force $F_L$ produced from the torque T of tire 600 causes a reactive road force $F_R$ and a resulting lug deflection $\Delta$. For a tire with a radius R that is running at a torque T, the force F is equal to the torque T divided by the tire radius R (F=T/R). In the illustrated embodiment, the reactive road force $F_R$ and the lug force $F_L$ are opposite forces that can vary in magnitude. In the illustration, the lug deflection $\Delta$ in the circumferential direction is represented by a circumferential change in the lug position between an initial lug position (represented by solid lines) and a secondary lug position (represented by dashed lines). The tire designer may use finite element analysis modeling or some other modeling technique of the tire 600 to determine the reactive road force $F_R$, the lug force $F_L$, and the resulting lug deflection $\Delta$ to calculate a circumferential shear stiffness $K_L$.

For a representative lug 620 in each rib (not shown) where the lug 620 has a length L, the circumferential shear stiffness is calculated using Equation (1):

$$K_L = \frac{F_L}{\Delta} \text{ (e.g., units of Lb/in or kg/m).} \quad (1)$$

Figure 7:
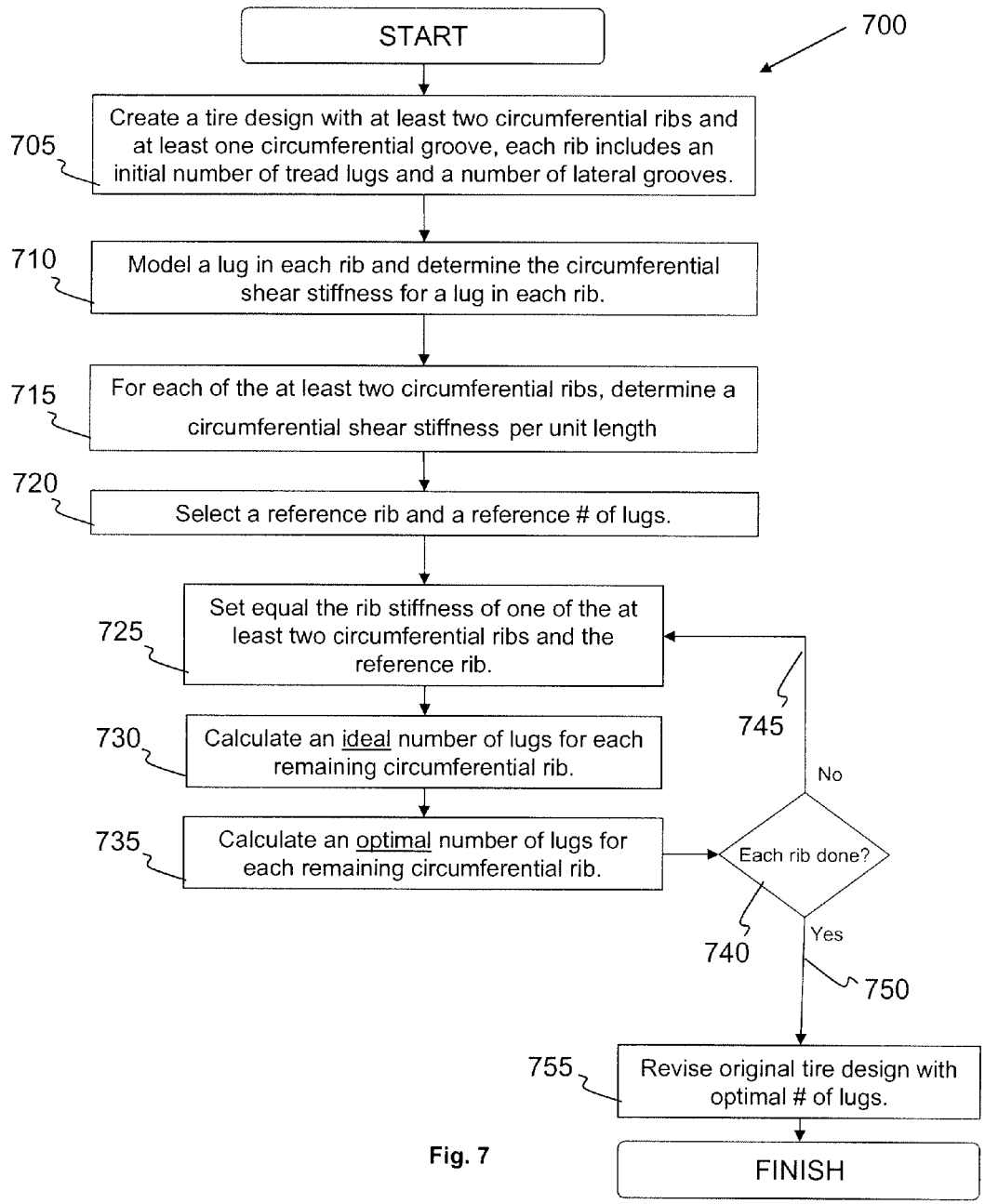
FIG. 7 illustrates a flow chart of one embodiment of a method of designing a tire having balanced rib stiffness.

FIG. 7 illustrates a flow chart of one embodiment of a balanced rib stiffness tire design method 700. A tire designer using the balanced rib stiffness tire design method 700 creates a tire model (e.g., a tire model with a tire tread as illustrated in FIGS. 2 and 3 and the tire tread illustrated in FIGS. 4 and 5), comprising a tread, sidewalls, and bead portions. The tire designer includes at least two unlocked circumferential ribs and at least one circumferential groove in the tread, each circumferential rib comprising an initial number of tread lugs separated by a number of lateral grooves in the circumferential direction of the tire. (Step 705).

The tire designer models a circumferential shear stiffness $K_L$ of a single lug in each rib by a modeling technique described above and illustrated in FIG. 6 (Step 710). The tire designer calculates circumferential shear stiffness per unit length $K_{Nx}$ for each rib by dividing each circumferential shear stiffness $K_L$ by a length L of the lug modeled for each rib (Step 715).

The tire designer can model each rib stiffness as a series of springs, with each lug in the rib represented as a spring, so the rib stiffness $K_{Rx}$ is about equal to an average rib stiffness $K_{AVG}$ divided by a number of lugs $N_X$ in a rib $x_i$ (where i is equal to 1 to n), shown below in Equation (2):

$$K_{R_X} = \frac{K_{AVG}}{N_X}. \quad (2)$$

The average rib stiffness $K_{AVG}$ is equal to the circumferential shear stiffness per unit length $K_{Nx}$ multiplied by the average rib length $L_{AVG}$, shown below in Equation (3):

$$K_{AVG} = K_{N_x} * L_{AVG}, \quad (3)$$

where the average rib length $L_{AVG}$ is equal to the circumference of the rib ($\pi$ times diameter) divided by the number of lugs $N_X$, shown below in Equation (4):

$$L_{AVG} = \frac{\pi * D}{N_X}. \quad (4)$$

Combining Equations (2), (3), and (4) results in:

$$K_{R_X} = \frac{K_{N_X} * \pi * D}{N_X^2}, \quad (5)$$

where D is the diameter of the tire and $N_X$ is the number of lugs in a given rib $x_i$. An approximation of $\pi$ may be employed.

The tire designer picks any rib as a reference rib $x_o$ and defines a number of lugs $N_o$ in the reference rib $x_o$ (Step 720). The tire designer calculates an ideal number of lugs (Ideal $N_x$) in each remaining rib $x_i$ by equating $K_{R_i} = K_{R_0}$ and employing equation (5):

$$\frac{K_{R_i} * \pi * D}{N_i^2} = \frac{K_{R_0} * \pi * D}{N_0^2} \text{(Step 725).} \quad (6)$$

A tire designer can then solve Equation (6) for an ideal number of lugs $N_i$ in rib $x_i$, to arrive at the following equation (9):

$$\text{Ideal } N_i = \sqrt{\frac{K_{R_i}}{K_{R_0}} * N_0^2} \text{ (Step 730),} \quad (7)$$

where rib $x_i$ is one of the at least two circumferential ribs, except the reference rib $x_o$, where $K_{R_i}$ is equal to the circumferential shear stiffness per unit length $K_{N_X}$ for one of the at least two circumferential ribs $x_i$, any of the ribs except the reference rib $x_o$, where $K_{R_0}$ is the circumferential shear stiffness per unit length $K_{N_X}$ for the reference rib $x_o$, and where $N_0$ is the number of lugs selected by the tire designer in the reference rib $x_o$.

Once the tire designer determines the ideal number of rib lugs (Ideal $N_i$), the tire designer then calculates an optimal number of lugs (Optimal $N_i$) as the nearest integer number of lugs closest to the Ideal $N_i$ because a physical tire has a whole number of lugs in each rib (Step 735). For example, if the partial value of Ideal $N_i$ is less than 0.5, e.g., 0.466, then the tire designer rounds down to the closest integer. If the partial value of Ideal $N_i$ is equal to or greater than 0.5, e.g., 0.649, then the tire designer rounds up to the closest integer.

The above steps are repeated for the remaining ribs $x_i$ (Steps 740, 745, 725, 730, and 735) until each rib has an optimal number of lugs (Optimal $N_i$). The original tire design is then revised to include the optimal number of lugs (Optimal $N_i$) (Step 750 and 755).

In one embodiment, a tire designer can produce tire designs using the balanced rib stiffness tire design method 700 where the optimal rib stiffness of the at least two ribs is within 5% of the optimal stiffness of the reference rib. In other embodiments, a tire designer can produce tire designs using the balanced rib stiffness tire design method 700 where the optimal rib stiffness of the at least two ribs is within about 3% or within about 1% of the optimal stiffness of the reference rib.

Tables A and B illustrate examples of how a tire designer can use the balanced rib stiffness tire design method 700 and should not be construed as limiting the scope or spirit of the present application. As is illustrated in the tables below, the design method can be used on a tire of any diameter that includes at least two circumferential ribs and at least one circumferential groove. Further, the design method can use any rib position as the reference rib $x_o$, can use any number of lugs $N_o$ for the initial rib $x_o$, and can use any circumferential shear stiffness per unit length $K_{N_x}$ for the reference rib $x_o$ and for each remaining rib to produce a tire design with balanced rib stiffness.

millimeter, and the deflection of the modeled lug in each rib is about 1 millimeter. For each rib, the circumferential shear stiffness per unit length $K_{N_x}$ is determined by dividing the circumferential shear stiffness $K_L$ by the length L of the modeled lug. Next, the tire designer selects any of the rib #'s 1-5, in this case rib #3, as the first rib $x_o$ and the number of ideal lugs $N_o$ is selected so an optimal stiffness can be determined. For this first rib, the optimal number of lugs is the same as the initial number of lugs, 70, and the circumferential shear stiffness for rib #3 is 177 N/mm, which produces an Ideal Stiffness of 177 N/mm and an equal Optimal Stiffness. The tire designer then selects a second rib $x_1$ (here, rib #2) and then determines the number of ideal lugs Ideal $N_x$, the number of optimal lugs Optimal $N_x$, and the ideal stiffness and opti-

TABLE A

| Step | | | | | | |
|---|---|---|---|---|---|---|
| 705 | rib # | 1 | 2 | 3 | 4 | 5 |
| 705 | Xi | 2 | 1 | 0 | 3 | 4 |
| 705 | Outside Diameter (D) (mm) | 557 | 557 | 557 | 557 | 557 |
| 705 | NOP | 70 | 70 | 70 | 70 | 70 |
| 705 | Pitch | 25 | 25 | 25 | 25 | 25 |
| 710 | Deflection (Delta) (mm) | 1 | 1 | 1 | 1 | 1 |
| 710 | Force (F) (N) | 137.6 | 67.5 | 177 | 53.6 | 225.9 |
| 710 | Modeled Lug Length (L) (mm) | 1 | 1 | 1 | 1 | 1 |
| 710 | Circumferential Shear Stiffness ($K_L$) (N/mm) | 137.60 | 67.50 | 177.00 | 53.60 | 225.90 |
| 715 | Circumferential Shear Stiffness per Unit Length ($K_{NX}$) (N/mm/mm) | 137.60 | 67.50 | 177.00 | 53.60 | 225.90 |
| 720 | $N_o$ | | | 70 | | |
| | $K_{NX}/K_{NO}$ | 0.777 | 0.381 | 1.000 | 0.303 | 1.276 |
| 730 | Ideal $N_i$ (partial lugs)) | 61.7 | 43.2 | 70.0 | 38.5 | 79.1 |
| 735 | Optimal $N_i$ (whole # of lugs) | 62 | 43 | 70 | 39 | 79 |
| 725, 730 | Ideal Rib Stiffness (partial lugs) | 177.0 | 177.0 | 177.0 | 177.0 | 177.0 |
| 725, 735 | Optimal Rib Stiffness (whole # of lugs) | 175.4 | 178.8 | 177.0 | 172.7 | 177.4 |
| — | Optimal Rib Stiffness/Ideal Rib Stiffness (%) | 99.10% | 101.06% | 100.00% | 97.55% | 100.20% |

Table A, shown above, is a table that shows how a tire designer uses the design method to design a tire having balanced rib stiffness. For example, a tire designer picks a tire that is 557 millimeters in diameter and includes five circumferentially continuous ribs (rib #'s 1-5) that are each laterally separated by at least one circumferentially continuous groove, adjacent ribs are unlocked. A tire designer using the balanced rib stiffness design method 700 designs a tire with 5 ribs and models a lug in each rib by applying a load F to a lug in each rib to determine the deflection per lug and the circumferential shear stiffness $K_L$. In this example, a force from about 50 Newtons to about 230 Newtons is applied to a lug in each rib, the length of the modeled lug in each rib is about 1 mal stiffness for rib #2. The design model produces 43.2 ideal lugs and 43 optimal lugs with an ideal stiffness of 177 N/mm and an optimal stiffness of 178.8 N/mm, so the stiffness of rib #2 is 1.06% off from its ideal stiffness. The designer then completes these calculations for the remaining ribs ($x_2$, $x_3$, $x_4$) to determine an ideal and an optimal number of lugs that will give an approximately equal optimal stiffness in each of the ribs in the tire design. As can be seen in the table above, the number of lugs in each rib varies, including 39 lugs in rib #4, 43 lugs in rib #2, 62 lugs in rib #1, 70 lugs in rib #3, and 79 lugs in rib #5. As a result, the optimal stiffness in each rib varies relative to an ideal stiffness from about 0.20% to about 2.45%.

TABLE B

| Step | | | | | | | |
|---|---|---|---|---|---|---|---|
| 705 | rib # | 1 | 2 | 3 | 4 | 5 | 6 |
| 705 | Xi | 2 | 1 | 0 | 0 | 3 | 4 |
| 705 | Outside Diameter (D) (mm) | 557 | 557 | 557 | 557 | 557 | 557 |
| 705 | NOP | 70 | 70 | 70 | 70 | 70 | 70 |
| 705 | Pitch | 25 | 25 | 25 | 25 | 25 | 25 |
| 710 | Deflection (Delta) (mm) | 1 | 1 | 1 | 1 | 1 | 1 |
| 710 | Force (F) (N) | 141.30 | 86.00 | 93.00 | 93.00 | 86.00 | 141.30 |
| 710 | Modeled Lug Length (L) (mm) | 1 | 1 | 1 | 1 | 1 | 1 |
| 710 | Circumferential Shear Stiffness ($K_L$) (N/mm) | 141.30 | 86.00 | 93.00 | 93.00 | 86.00 | 141.30 |

TABLE B-continued

| Step | | | | | | | |
|---|---|---|---|---|---|---|---|
| 715 | Circumferential Shear Stiffness per Unit Length ($K_{NX}$) (N/mm/mm) | 141.3 | 86.0 | 93.00 | 93.00 | 86.0 | 141.3 |
| 720 | $N_o$ | | | 70 | 70 | | |
| | $K_{NX}/K_{NO}$ | 1.519 | 0.925 | 1.000 | 1.000 | 0.925 | 1.519 |
| 730 | Ideal $N_i$ (partial lugs)) | 86.3 | 67.3 | 70.0 | 70.0 | 67.3 | 86.3 |
| 735 | Optimal $N_i$ (whole # of lugs) | 86 | 67 | 70 | 70 | 67 | 86 |
| 725, 730 | Ideal Rib Stiffness (partial lugs) | 93.0 | 93.0 | 93.0 | 93.0 | 93.0 | 93.0 |
| 725, 735 | Optimal Rib Stiffness (whole # of lugs) | 93.61 | 93.87 | 93.0 | 93.0 | 93.9 | 93.6 |
| — | Optimal Rib Stiffness/Ideal Rib Stiffness (%) | 100.66% | 100.94% | 100.00% | 100.00% | 100.94% | 100.66% |

Table B, shown above, is a table that shows how a tire designer uses the design method to design a tire having balanced rib stiffness. For example, a tire designer picks a tire that is 557 millimeters in diameter and includes six circumferentially continuous ribs (rib #'s 1-6). In this example, the ribs are each laterally separated by at least one circumferentially continuous groove so adjacent ribs are unlocked, except ribs 3 and 4 are locked relative to one another and unlocked relative to other adjacent ribs. A tire designer using the balanced rib stiffness design method 700 designs a tire with 6 ribs and models a lug in each rib by applying a load F to a lug in each rib to determine the deflection per lug and the circumferential shear stiffness $K_L$. In this example, a force from about 86 Newtons to about 142 Newtons is applied to a lug in each rib, the length of the modeled lug in each rib is about 1 millimeter, and the deflection of the modeled lug in each rib is about 1 millimeter. For each rib, the circumferential shear stiffness per unit length $K_{N_X}$ is determined by dividing the circumferential shear stiffness $K_L$ by the length L of the modeled lug. The tire designer selects any of the rib #'s 1-6, in this case ribs #3 and #4, as the first rib $x_o$ (both ribs are selected since they are in a locked relationship) and the number of ideal lugs $N_o$ is selected so an optimal stiffness can be determined. For these ribs, the optimal number of lugs is the same as the initial number of lugs, 70, and the circumferential shear stiffness for ribs #3 and #4 is 93 N/mm, which produces an Ideal Stiffness of 93 N/mm and an equal Optimal Stiffness. The tire designer then selects a second rib $x_1$ (here, rib #2) and then determines the number of ideal lugs Ideal $N_x$, the number of optimal lugs Optimal $N_x$, and the ideal stiffness and optimal stiffness for rib #2. The design model produces 67.3 ideal lugs and 67 optimal lugs with an ideal stiffness of 93 N/mm and an optimal stiffness of 93.87 N/mm, so the stiffness of rib #2 is 0.94% off from its ideal stiffness. The designer then completes these calculations for the remaining ribs ($x_2$, $x_3$, $x_4$) to determine an ideal and an optimal number of lugs that will give an approximately equal optimal stiffness in each of the ribs in the tire design. As can be seen in the table above, the number of lugs in each rib varies, including 67 lugs in ribs #2 and #5, 70 lugs in ribs #3 and #4, and 86 lugs in ribs #1 and #6. As optimal stiffness in each rib varies relative to an ideal stiffness from about 0.66% to about 0.94%.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components.

While the present application illustrates various embodiments, and while these embodiments have been described in some detail, it is not the intention of the applicant to restrict or in any way limit the scope of the appended claims to such detail. Additional advantages and modifications will readily appear to those skilled in the art. Therefore, the invention, in its broader aspects, is not limited to the specific details, the representative embodiments, and illustrative examples shown and described. Accordingly, departures may be made from such details without departing from the spirit or scope of the applicant's general inventive concept.

What is claimed is:

1. A method of designing a tire, the method comprising:
modeling a tire design that includes a tire tread with a plurality of circumferential ribs having a plurality of lugs and a plurality of circumferential continuous grooves, including at least two circumferential ribs that are laterally unlocked from each other by an adjacent circumferentially continuous groove;
modeling a lug having a specific length in each of the plurality of circumferential ribs and determining a circumferential shear stiffness for the lug in each of the plurality of circumferential ribs;
determining a circumferential shear stiffness per unit length for each of the plurality of circumferential ribs;
selecting a reference rib, wherein the reference rib has a reference number of lugs;
modeling the plurality of circumferential ribs
calculating an ideal number of lugs for each of the plurality of circumferential ribs;
calculating an optimum number of lugs for each of the plurality of circumferential ribs by rounding the ideal number of lugs to a nearest integer; and
modifying the tire design to include the optimum number of lugs determined for each of the plurality of circumferential ribs.

2. The tire design method of claim 1, wherein the circumferential shear stiffness for a lug in each rib $K_L$, is a lug force $F_L$ divided by a lug deflection $\Delta$.

3. The tire design method of claim 2, wherein the circumferential shear stiffness per unit length for a lug in each rib $K_{N_X}$ is a circumferential shear stiffness $K_L$ divided by a length L of the modeled lug.

4. The tire design method of claim 3, wherein a rib stiffness for each rib is expressed in the following equation:

$$K_{R_X} = \frac{K_{N_X} * \pi * D}{N_X^2},$$

where D is a diameter of the rib, $N_X$ is a number of lugs in a rib, and $K_{N_X}$ is the circumferential shear stiffness per unit length for a lug in each rib.

5. The tire design method of claim 4, wherein the ideal number of lugs is expressed in the following equation:

$$\text{Ideal } N_i = \sqrt{\frac{K_{R_i}}{K_{R_0}} * N_0^2},$$

where $K_{R_i}$ is the circumferential shear stiffness per unit length $K_{N_X}$ for a rib $X_i$, where $X_i$ is any of the ribs except the reference rib $x_o$, where $K_{R_0}$ is a circumferential shear stiffness per unit length $K_{N_X}$ for the reference rib $x_o$, and $N_0$ is the reference number of lugs in the reference rib.

6. The tire design method of claim 1, wherein a circumferential shear stiffness of the plurality of circumferential ribs is within 5% of a circumferential shear stiffness of the reference rib.

7. The tire design method of claim 1, wherein a circumferential shear stiffness of the plurality of circumferential ribs is within 3% of a circumferential shear stiffness of the reference rib.

8. The tire design method of claim 1, wherein a circumferential shear stiffness of the plurality of circumferential ribs is within 1% of a circumferential shear stiffness of the reference rib.

9. A method of modeling a tire, the method comprising:
providing a tire design having a lug of a specific length in each of at least two circumferential ribs;
modeling the lug under a force to determine a deflection, wherein two circumferential ribs of the at least two circumferential ribs are laterally unlocked;
calculating an ideal number of lugs and an optimal number of lugs for each of the at least two circumferential ribs, wherein the optimal number of lugs for each of the at least two circumferential ribs is rounded to a closest integer; and
replacing in the tire design the optimal number of lugs determined for each of the at least two circumferential ribs and remodeling the tire design.

10. The method of claim 9, wherein a circumferential shear stiffness for a lug in each rib $K_L$ is a lug force $F_L$ divided by a lug deflection $\Delta$.

11. The method of claim 10, wherein a circumferential shear stiffness per unit length for a lug in each rib $K_{N_X}$ is a circumferential shear stiffness $K_L$ divided by a length L of the modeled lug.

12. The method of claim 11, wherein a circumferential shear stiffness for each of the at least two circumferential ribs is expressed in the following equation:

$$K_{R_X} = \frac{K_{N_X} * \pi * D}{N_X^2},$$

where D is a diameter of the tire, $N_X$ is a number of lugs in a rib, and $K_{N_X}$ is the circumferential shear stiffness per unit length for a lug in each rib.

13. The method of claim 12, wherein the ideal number of lugs for each of the at least two circumferential ribs, is expressed in the following equation:

$$\text{Ideal } N_i = \sqrt{\frac{K_{R_i}}{K_{R_0}} * N_0^2},$$

where $K_{R_i}$ is a circumferential shear stiffness per unit length $K_{N_X}$ for a rib $x_i$, where $x_i$ is any of the ribs except a reference rib $x_o$, where $K_{R_0}$ is a circumferential shear stiffness per unit length $K_{N_X}$ for the reference rib $x_o$, and $N_0$ is a reference number of lugs in the reference rib $x_o$, and
the optimal number of lugs is determined by rounding the ideal number of lugs to a nearest integer.

14. The method of claim 13, wherein the circumferential shear stiffness of each of the at least two circumferential ribs is within 3% of the circumferential shear stiffness of the reference rib.

15. The method of claim 13, wherein the circumferential shear stiffness of each of the at least two ribs is within 1% of the circumferential shear stiffness of the reference rib.

16. A method of modifying an existing tire design that includes at least two circumferential ribs and at least one circumferential groove, wherein each rib includes an initial number of tread lugs and a number of lateral grooves, the method comprising:
modeling a lug in each of the at least two circumferential ribs and determining a circumferential shear stiffness for a lug in each rib;
calculating a circumferential shear stiffness per unit length for each of the at least two circumferential ribs;
selecting a reference rib and a reference number of lugs for the reference rib;
adjusting a rib stiffness for each remaining circumferential rib such that it is equal to a rib stiffness of the reference rib;
calculating an ideal number of lugs for each remaining circumferential rib;
calculating an optimal number of lugs for each remaining circumferential rib; and
revising the existing tire design with an optimal number of lugs for each of the at least two circumferential ribs.

17. The tire design method of claim 16, wherein the rib stiffness of each of the at least two ribs is within 1% of the rib stiffness of the reference rib.

* * * * *